United States Patent
Kobayashi et al.

(10) Patent No.: US 7,439,196 B2
(45) Date of Patent: Oct. 21, 2008

(54) METHOD FOR MANUFACTURING PATTERN FORMED STRUCTURE

(75) Inventors: Hironori Kobayashi, Tokyo (JP); Yusuke Uno, Tokyo (JP)

(73) Assignee: DAI Nippon Printing Co., Ltd., Tokyo-to (JP)

( * ) Notice: Subject to any disclaimer, the term of this patent is extended or adjusted under 35 U.S.C. 154(b) by 405 days.

(21) Appl. No.: 11/100,358

(22) Filed: Apr. 6, 2005

(65) Prior Publication Data
US 2006/0006373 A1    Jan. 12, 2006

(30) Foreign Application Priority Data
Apr. 7, 2004    (JP)    ............... 2004-112998

(51) Int. Cl.
*H01L 21/00*    (2006.01)
(52) U.S. Cl. ............... 438/795; 438/799; 257/E21.027; 257/E21.035
(58) Field of Classification Search ........ 438/795, 438/799, 797, 1; 257/E21.027, E21.035, 257/436
See application file for complete search history.

(56) References Cited

U.S. PATENT DOCUMENTS 6,093,676 A * 7/2000 Heller et al. ............ 502/242

2002/0012856 A1 * 1/2002 Ohtsu et al. ............ 430/7
2005/0028698 A1 * 2/2005 Mori et al. ............ 101/467

FOREIGN PATENT DOCUMENTS

JP    2001-074928    3/2001

* cited by examiner

*Primary Examiner*—Caridad M Everhart
(74) *Attorney, Agent, or Firm*—Ladas & Parry LLP

(57) ABSTRACT

The main object of the present invention is to provide a method for manufacturing efficiently a pattern formed structure which has a surface having a property-varied pattern and can be used to manufacture a color filter or the like.

In order to achieve the object, the present invention provides a method for manufacturing a pattern formed structure, comprising: a patterning substrate preparing process of preparing a patterning substrate having a base material and a photocatalyst-containing property variable layer which is formed on the base material, comprises at least a photocatalyst and a binder, and has a property variable by action of the photocatalyst based on irradiation with energy; and an energy radiating process of radiating energy onto the patterning substrate at an intensity of 0.1 to 10 mW/cm$^2$, thereby forming a property variable pattern in which the property of the photocatalyst-containing property variable layer is varied.

22 Claims, 2 Drawing Sheets

METHOD FOR MANUFACTURING PATTERN FORMED STRUCTURE

BACKGROUND OF THE INVENTION

1. Field of the Invention

The present invention relates to a method for manufacturing a pattern formed structure which has, in its surface, a pattern having different properties and can be used for various articles, a typical example of which is a color filter.

2. Description of the Related Art

Recently, with the development of the personal computers, in particular, the development of the portable personal computers, demand for a liquid crystal display, especially a color liquid crystal display tends to be increased. However, the color liquid displays are expensive; therefore, a request that the cost thereof should be reduced has been increasing. In particular, a request that the cost of their color filters, which accounts for a high ratio in the total cost, should be reduced has been raised.

Thus, the present inventors have been investigating a method of using a property variable pattern forming coating solution which contains a photocatalyst and a material having a property variable by action of the photocatalyst based on irradiation with energy to form a photocatalyst containing layer on a base material, and radiating light in a pattern form onto this layer, thereby forming a pattern having varied properties (Japanese Patent Application Laid-Open (JP-A) No. 2001-074928). According to this method, the property of the photocatalyst containing layer is used to make it possible to form a functional portion, such as a colored layer, easily.

In the method for manufacturing a pattern formed structure using such a photocatalyst containing layer, for the light radiation to excite the photocatalyst therein, there is used a method of using a high energy lamp, such as a mercury lamp or a metal halide lamp, to radiate energy at a high intensity from the viewpoint of production efficiency and others. In recent years, however, the area of color filters or the like has been required to be made larger. In the method, the area which can be irradiated with energy is narrow, and a further improvement in production efficiency has also been required.

SUMMARY OF THE INVENTION

Thus, it has been desired to provide a method for efficiently manufacturing a pattern formed structure which has a surface having a property-varied pattern and can be used to manufacture a color filter or the like.

The present invention provides a method for manufacturing a pattern formed structure, comprising: a patterning substrate preparing process of preparing a patterning substrate having a base material and a photocatalyst-containing property variable layer which is formed on the base material, comprises at least a photocatalyst and a binder, and has a property variable by action of the photocatalyst based on irradiation with energy; and an energy radiating process of radiating energy onto the patterning substrate at an intensity of 0.1 to 10 mW/cm$^2$, thereby forming a property variable pattern in which the property of the photocatalyst-containing property variable layer is varied.

In the invention, the patterning substrate prepared in the patterning substrate preparing process has the photocatalyst-containing property variable layer; therefore, when energy is radiated onto this photocatalyst-containing property variable layer in the energy radiating process, the photocatalyst contained in the photocatalyst-containing property variable layer can be excited so that the property can be varied by action of this photocatalyst. At this time, in the invention, the intensity of the energy radiated in the energy radiating process can be made smaller than that used in ordinary patterning; therefore, the photocatalyst can be efficiently excited so that the total light quantity can be made remarkably small. Accordingly, according to the invention, a pattern formed structure can be effectively manufactured.

The present invention also provides a method for manufacturing a pattern formed structure, comprising: a patterning substrate preparing process of preparing a patterning substrate having a base material, a photocatalyst containing layer which is formed on the base material and comprises at least a photocatalyst, and a property variable layer which is formed on the photocatalyst containing layer and has a property variable by action of the photocatalyst based on irradiation with energy; and an energy radiating process of radiating energy onto the patterning substrate at an intensity of 0.1 to 10 mW/cm$^2$, thereby forming a property variable pattern in which the property of the property variable layer is varied.

In the invention, the patterning substrate prepared in the patterning substrate preparing process has the photocatalyst containing layer and the property variable layer; therefore, when energy is radiated onto the patterning substrate in the energy radiating process, the property of the property variable layer can be varied by action of the photocatalyst in the photocatalyst containing layer. In addition, at this time, in the invention, the intensity of the energy radiated in the energy radiating process can be made smaller than that used in ordinary patterning; therefore, the photocatalyst can be efficiently excited so that the total light quantity can be made remarkably small. Accordingly, according to the invention, a pattern formed structure can be effectively and cheaply manufactured.

In the present invention, a light shielding part is formed on the base material or on the photocatalyst containing layer of the patterning substrate, and a radiation of the energy in the energy radiating process is performed from the side of the base material. In this case, the property of the photocatalyst-containing property variable layer or the property variable layer only inside the region in which the light shielding part is not formed can be varied without using any photomask or the like in the energy radiating process. Accordingly, the step of positioning a photomask or the like is unnecessary and thus a pattern formed structure can be manufactured more effectively. Furthermore, even if the energy radiated in the energy radiating process is scattered light, the light can reach the photocatalyst containing layer or the photocatalyst-containing property variable layer without diffusing, thereby giving an advantage that the scope from which the light source used in the energy radiating process can be selected is widened.

In the present invention, it is preferred that the energy radiation is performed from a fluorescent lamp which emits light having a wavelength in the range of 250 to 450 nm. This makes it possible to radiate the energy by use of a lamp which emits a low energy having a long wavelength so as to make an especial device or equipment unnecessary. The light having the above-mentioned wavelength has an advantage that the light produces no effect onto the human body.

In this case, it is preferred that the fluorescent lamp is a cold cathode type fluorescent lamp and is a lamp selected from a black light, a health lamp, and a germicidal lamp. Since these lamps can be rendered a line light source, energy can be radiated onto the patterning substrate having a large area at a time. No especial device is necessary for radiation of energy from these lamps and further they have a relatively long lifespan; accordingly, the use of these lamps is also preferred from the viewpoint of production costs.

The present invention also provides a method for manufacturing a functional element, comprising a functional portion forming process of forming a functional portion on the property variable pattern of the pattern formed structure manufactured by the method for manufacturing a pattern formed structure.

According to the invention, the property variable pattern in which the property is varied is formed on the pattern formed structure; therefore, a highly precise functional portion can easily be formed by using this property difference inside the property variable pattern.

The present invention also provides a method for manufacturing a color filter, wherein the functional portion forming process in the above-mentioned method for manufacturing a functional element is a colored layer forming process of forming a colored layer.

According to the invention, a highly precise colored layer can easily be formed by, for example, an ink-jetting method using, for instance, a wettability difference inside the property variable pattern.

The present invention also provides a method for manufacturing an electroconductive pattern in which the functional portion forming process in the above-mentioned method for manufacturing a functional element is a process of forming metallic wiring.

According to the invention, metallic wiring can easily be formed by, for example, an electric field jetting method using, for instance, a property difference inside the property variable pattern.

The present invention also provides a method for manufacturing an organic electroluminescent element in which the functional portion forming process in the above-mentioned method for manufacturing a functional element is a process of forming an organic electroluminescent (hereinafter abbreviated to "organic EL" as the case may be) layer.

According to the invention, an organic EL layer can be formed in a highly precise pattern form, using a property difference inside the property variable layer. Consequently, a high-quality organic EL element can be manufactured.

The present invention also provides a method for manufacturing a base material for biochip in which the functional portion forming process in the above-mentioned method for manufacturing a functional element is a process of forming a functional portion having adhesive property to a biological material.

According to the invention, this functional portion, which has adhesive property to a biological material, can be formed in a highly precise pattern form. Thus, the base material for biochip can be rendered a high-quality base material for biochip.

The present invention produces advantageous effects that the photocatalyst can be effectively excited so as to make it possible to manufacture a pattern formed structure having a property variable pattern with a property-varied surface based on a small total light quantity.

DESCRIPTION OF THE PREFERRED EMBODIMENTS

The present invention relates to a method for manufacturing a pattern formed structure which has, in its surface, a pattern having different properties and can be used for various articles, a typical example of which is a color filter; a method for manufacturing a functional element using the pattern formed structure; and others. The following will describe each of them.

A. Method for Manufacturing a Pattern Formed Structure

First, the method for manufacturing a pattern formed structure of the present invention is described. The method is classified into two embodiments. Any one of the embodiments makes it possible to efficiently manufacture a pattern formed structure having a property variable pattern with a property-varied surface based on a low total light quantity. The following will describe each of the embodiments in detail.

1. First Embodiment

First, a first embodiment of the method for manufacturing a pattern formed structure of the present invention is described. The first embodiment is a method for manufacturing a pattern formed structure, comprising: a patterning substrate preparing process of preparing a patterning substrate having a base material and a photocatalyst-containing property variable layer which is formed on the base material, comprises at least a photocatalyst and a binder, and has a property variable by action of the photocatalyst based on irradiation with energy; and an energy radiating process of radiating energy onto the patterning substrate at a given intensity, thereby forming a property variable pattern in which the property of the photocatalyst-containing property variable layer is varied.

Figure 1A:
FIGS. 1A to 1C are process charts illustrating an example of the method for manufacturing a pattern formed structure of the invention.
Figure 1B:
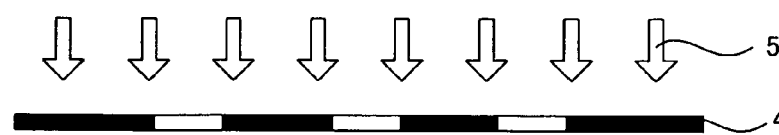
Figure 1B:
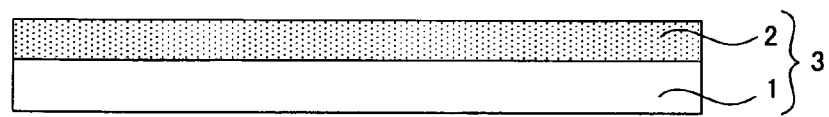
Figure 1C:
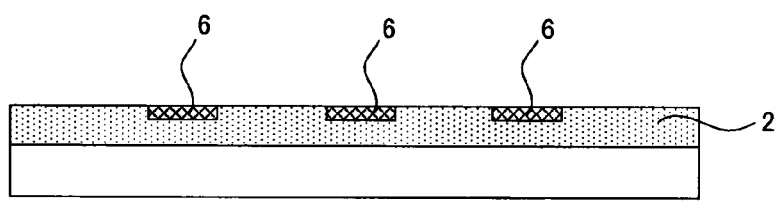

As shown in, e.g., FIGS. 1A to 1C, the method for manufacturing a pattern formed structure of the present embodiment has a patterning substrate preparing process of forming a patterning substrate 3 having a base material 1 and a photocatalyst-containing property variable layer 2 formed on the base material 1 (FIG. 1A); and an energy radiating process of radiating energy 5 having a given intensity onto the patterning substrate 3 through such as a photomask 4 (FIG. 1B) so as to form a property variable pattern 6 in which the property of the photocatalyst-containing property variable layer 2 is varied (FIG. 1C).

According to the embodiment, the patterning substrate prepared in the patterning substrate preparing process has the photocatalyst-containing property variable layer; therefore, when energy is radiated onto the layer in the energy radiating process, the photocatalyst in the layer can be excited so that the property of the layer can be varied to form a property variable pattern easily. Therefore, using a property difference inside this property variable pattern, it is possible to easily form a pattern formed structure in which various functional portions, such as a colored layer of a color filter, can be formed.

In the energy radiating process in the embodiment, energy radiated has a smaller intensity than energy radiated for ordinal patterning which uses a photocatalyst. In the case when the photocatalyst is irradiated with a low energy so as to be excited, the photocatalyst exhibits a higher quantum efficiency to make the total light quantity smaller than in the case when the photocatalyst is irradiated with a high energy so as to be excited. According to the embodiment, therefore, a pattern formed structure can be effectively manufactured based on a smaller energy amount.

The following will describe each of the processes in the method for manufacturing a patterning substrate of the embodiment in detail.

(1) Patterning Substrate Preparing Process

First, the patterning substrate preparing process in the present embodiment is not particularly limited if the process is a process of preparing a patterning substrate having a base material and the photocatalyst-containing property variable layer which is formed on the base material, comprises at least a photocatalyst and a binder, and has a property variable by action of the photocatalyst based on irradiation with energy. The process can usually be rendered a process of forming the photocatalyst-containing property variable layer on a base material. The following will describe the photocatalyst-containing property variable layer and the base material used in the patterning substrate prepared in the present process.

(Photocatalyst-containing Property Variable Layer)

First, the photocatalyst-containing property variable layer used in the patterning substrate prepared in the present process is described. The photocatalyst-containing property variable layer is a layer comprising at least a photocatalyst and a binder. This layer may be any layer that is varied in property by action of the photocatalyst based on irradiation with energy, and the kind or the like of the property variation is not particularly limited. The layer may be, for example, a layer which is varied in adhesive property to a material by action of the photocatalyst or a layer which is varied in adhesive property to cells based on irradiation with energy.

In the present embodiment, it is particularly preferred that the photocatalyst-containing property variable layer is a photocatalyst-containing wettability variable layer the contact angle of which with a liquid is lowered by action of the photocatalyst based on irradiation with energy. This makes it possible to form a functional portion easily on the property variable pattern of the pattern formed structure g which is manufactured according to the present embodiment by, for example, ink-jetting.

No especial limitation is imposed on the photocatalyst-containing wettability variable layer if the layer is a layer having a surface the contact angle of which with a liquid is lowered by energy radiated in the energy radiating process which will be detailed later. By use of this layer, energy radiation in the energy radiating process makes it possible to form a property variable pattern having a lyophilic region small in contact angle with the liquid; therefore, a functional portion forming coating solution, such as a colored layer forming coating solution for forming a colored layer of a color filter, can be caused to adhere highly precisely onto the lyophilic region. Consequently, a functional element, such as a color filter, can be effectively formed.

The lyophilic region referred to herein is a region having a small contact angle with a liquid, and is a region having a good wettability to a functional portion forming coating solution for forming a functional portion on a manufactured pattern formed structure, for example, a colored layer forming coating solution for forming a colored layer when the functional element is, for instance, a color filter, or a metallic wiring forming coating solution when the functional element is metallic wiring. On the other hand, a liquid repellent region is a region having a large contact angle with a liquid, and is a region having a poor wettability to the above-mentioned functional portion forming coating solution.

In the present embodiment, a region about which the contact angle with a liquid is 1° or lower than that of an adjacent region is defined as a lyophilic region, and a region about which the contact angle with a liquid is 1° or higher than that of an adjacent region is defined as a liquid repellent region.

As for the photocatalyst-containing wettability variable layer used in the embodiment, in the region not irradiated with energy, that is, in the liquid repellent region, it is preferable to have the contact angle with a liquid having a surface tension of 40 mN/m is 10° or more, more preferably, the contact angle with a liquid having a surface tension of 30 mN/m is 10° or more, and even more preferably the contact angle with a liquid having a surface tension of 20 mN/m is 10° or more for the following reason: the region not irradiated with the energy is a region for which liquid repellency is required; therefore, in the case that the contact angle with the above-mentioned liquid is small, the liquid repellency is insufficient; and, for example, when a colored layer forming coating solution for forming a colored layer of a color filter is applied by an ink-jetting method or the like and hardened so as to form the colored layer, the colored layer forming coating solution may also adhere onto the liquid repellent region; it therefore becomes difficult to form a functional portion such as a colored layer, highly precisely.

As for the photocatalyst-containing wettability variable layer, in the region irradiated with energy, that is, in the lyophilic region, preferably, the contact angle with a liquid having a surface tension of 40 mN/m is less than 9°, more preferably, the contact angle with a liquid having a surface tension of 50 mN/m is 10° or less, and even more preferably the contact angle with a liquid having a surface tension of 60 mN/m is 10° or less for the following reason: in the case that the contact angle with the liquid is high in the region irradiated with the energy, that is, in the lyophilic region, the lyophilic region also repels, for example, a colored layer forming coating solution for forming a colored layer of a color filter; and, for instance, when the colored layer forming coating solution is applied by an ink-jetting method, this solution is not sufficiently applied or spread; it therefore becomes difficult to form a functional portion such as a colored layer.

The contact angle with respect to a liquid here is obtained from the results or a graph of the results of measuring (30 seconds after of dropping liquid droplets from a micro syringe) the contact angle with respect to liquids having various surface tensions using a contact angle measuring device (CA-Z type manufactured by Kyowa Interface Science, Co., Ltd). Moreover, at the time of the measurement, as the liquids having the various surface tensions, wetting index standard solution manufactured by JUNSEI CHEMICAL CO., LTD. were used.

According to the photocatalyst-containing property variable layer used in the present embodiment, the photocatalyst-containing property variable layer may be formed such that a fluorine is contained, and furthermore, the fluorine content of the photocatalyst-containing property variable layer surface is lowered at the time of directing an energy to the photocatalyst-containing property variable layer according to the function of the photocatalyst compared with the state before the energy irradiation. Moreover, it may be formed including a decomposing substance to be decomposed by the function of the photocatalyst based on the energy irradiation, and thereby changing the wettability on the photocatalyst-containing property variable layer.

The action mechanism of the photocatalyst that will be detailed below, a typical example of which is titanium dioxide, in the above-mentioned photocatalyst-containing wettability variable layer is not necessarily clear, but would be as follows: carries generated by radiation of light react directly with adjacent chemical species or are combined with oxygen or active oxygen species generated in the presence of water, so as to change the chemical structure of organic materials; and in the present embodiment, the carries act onto a binder compound in the photocatalyst-containing wettability variable layer so as to change the wettability of its surface.

The following will describe the photocatalyst, the binder and other components which constitute the photocatalyst-containing wettability variable layer.

a. Photocatalyst

First, the photocatalyst used in the present embodiment will be explained. As the photocatalyst used in the present embodiment, those known as photo semiconductors, such as a titanium dioxide ($TiO_2$), a zinc oxide (ZnO), a tin oxide ($SnO_2$), a strontium titanate ($SrTiO_3$), a tungsten oxide ($WO_3$), a bismuth oxide ($Bi_2O_3$), and an iron oxide ($Fe_2O_3$) can be presented, and one or two or more kinds as a mixture can be selected and used from them.

According to the present embodiment, in particular, a titanium dioxide can be used preferably since it has high band gap energy, it is chemically stable without the toxicity, and it can be obtained easily. There are an anatase type and a rutile type in the titanium dioxides, and either can be used in the present embodiment, however, the anatase type titanium dioxide is preferable. The anatase type titanium dioxide has a 380 nm or less excitation wavelength.

As the anatase type titanium dioxide, for example, a hydrochloric acid deflocculation type anatase type titania sol (STS-02 (average particle diameter 7 nm) manufactured by ISHIHARA SANGYO KAISHA, LTD., ST-K01 manufactured by ISHIHARA SANGYO KAISHA, LTD.), a nitric acid deflocculation type anatase type titania sol (TA-15 (average particle diameter 12 nm) manufactured by Nissan Chemical Industries, Ltd.), or the like can be presented.

With a smaller particle diameter of the photocatalyst, the photocalytic reaction can be generated effectively, and thus it is preferable. An average particle diameter of 50 nm or less is preferable, and use of a photocatalyst of 20 nm or less is particularly preferable.

The photocatalyst content in the photocatalyst-containing wettability variable layer used in the present embodiment can be set in a range of 5 to 60% by weight, preferably in a range of 20 to 40% by weight. The thickness of the photocatalyst-containing wettability variable layer is preferably from 0.05 to 10 µm.

b. Binder

The following will describe the binder used in the present embodiment. A variation in the wettability on the photocatalyst-containing wettability variable layer in the embodiment can be classified into 3 forms, that is, a form in which the variation is attained by the action of the photocatalyst onto the binder itself (the first form), a form in which the photocatalyst-containing wettability variable layer is caused to contain a decomposable compound which can be decomposed by action of the photocatalyst based on irradiation with energy so as to vary the wettability on this layer, thereby varying the wettability (the second form), and a form in which these forms are combined with each other (the third from). The binder used in the first and third forms needs to have a function capable of varying the wettability on the photocatalyst-containing wettability variable layer by action of the photocatalyst, and the binder used in the second form does not need to have this function.

First, the binder used in the second form is described, which is a binder that does not need to have a function capable of varying the wettability on the photocatalyst-containing wettability variable layer by action of the photocatalyst. As for the next, The binder used in the first and third forms which has a function capable of varying the wettability on the photocatalyst-containing wettability variable layer by action of the photocatalyst is described.

As for the second form binder, it is not limited to any especial kind if the binder is a binder having such a high bond energy that its main skeleton is not decomposed by the photoexcitation of the photocatalyst. Specific examples thereof include polysiloxanes having no organic substituent or having organic substituents. These can be obtained by hydrolyzing and polycondensing tetramethoxysilane, tetraethoxysilane or the like.

In the case that such a binder is used, it is essential to incorporate, as an additive, the following compound into this layer: a decomposable compound which can be decomposed by action of the photocatalyst based on irradiation with energy, whereby the wettability on this photocatalyst-containing wettability variable layer can be varied.

The following will describe the binder used in the first and third embodiments which needs to have a function capable of varying the wettability on the photocatalyst-containing wettability variable layer by action of the photocatalyst. As such binder, those having a high bond energy such that the main skeleton is not decomposed by the photoexcitation of the photocatalyst, and an organic substituent to be decomposed by the function of the photocatalyst are preferable. For example, (1) an organopolysiloxane to provide high strength by hydrolysis or polycondensation of a chloro or alkoxy silane, or the like by the sol gel reaction or the like, (2) an organopolysiloxane obtained by cross-linking a reactive silicone having the excellent water repellent property or the oil repellent property, or the like can be presented.

In the case (1), it is preferably an organopolysiloxane as a hydrolyzed condensation product or a co-hydrolyzed condensation product of one or two or more kinds of silicon compounds represented by the general formula:

$$Y_n SiX_{(4-n)}$$

(Here, Y is an alkyl group, a fluoroalkyl group, a vinyl group, an amino group, a phenyl group, an epoxy group or a group containing them, and X is an alkoxyl group, an acetyl group or a halogen. n is an integer from 0 to 3). Here, the alkoxy group represented by X is preferably a methoxy group, an ethoxy group, a propoxy group, or a butoxy group. Moreover, the number of atoms of the entire group represented by Y is preferably in a range of 1 to 20, in particular, in a range of 5 to 10.

Thereby, at the time of forming the photocatalyst-containing wettability variable layer, the surface can be provided with the liquid repellent property by the Y comprising the organopolysiloxane. Moreover, according to the function of the photocatalyst accompanied by the energy irradiation, the lyophilic property can be provided by the decomposition of the Y, or the like.

Moreover, since the photocatalyst-containing wettability variable layer before the energy irradiation can have the particularly high liquid repellent property in the case an organopolysiloxane having the Y comprising the organopolysiloxane as a fluoroalkyl group, it is preferable to use an organopolysiloxane having the fluoroalkyl group in the case a high liquid repellent property is required, or the like. As such an organopolysiloxane, specifically, a hydrolyzed condensation product or a co-hydrolyzed condensation product of one or two or more kinds of the below-mentioned fluoroalkylsilanes can be presented. Those known as a fluorine based silane coupling agent can be used.

$CF_3(CF_2)_3CH_2CH_2Si(OCH_3)_3$;
$CF_3(CF_2)_5CH_2CH_2Si(OCH_3)_3$;
$CF_3(CF_2)_7CH_2CH_2Si(OCH_3)_3$;
$CF_3(CF_2)_9CH_2CH_2Si(OCH_3)_3$;
$(CF_3)_2CF(CF_2)_4CH_2CH_2Si(OCH_3)_3$;
$(CF_3)_2CF(CF_2)_6CH_2CH_2Si(OCH_3)_3$;
$(CF_3)_2CF(CF_2)_8CH_2CH_2Si(OCH_3)_3$;
$CF_3(C_6H_4)C_2H_4Si(OCH_3)_3$;
$CF_3(CF_2)_3(C_6H_4)C_2H_4Si(OCH_3)_3$;
$CF_3(CF_2)_5(C_6H_4)C_2H_4Si(OCH_3)_3$;
$CF_3(CF_2)_7(C_6H_4)C_2H_4Si(OCH_3)_3$;
$CF_3(CF_2)_3CH_2CH_2SiCH_3(OCH_3)_2$;
$CF_3(CF_2)_5CH_2CH_2SiCH_3(OCH_3)_2$;
$CF_3(CF_2)_7CH_2CH_2SiCH_3(OCH_3)_2$;
$CF_3(CF_2)_9CH_2CH_2SiCH_3(OCH_3)_2$;
$(CF_3)_2CF(CF_2)_4CH_2CH_2SiCH_3(OCH_3)_2$;
$(CF_3)_2CF(CF_2)_6CH_2CH_2SiCH_3(OCH_3)_2$;
$(CF_3)_2CF(CF_2)_8CH_2CH_2SiCH_3(OCH_3)_2$;
$CF_3(C_6H_4)C_2H_4SiCH_3(OCH_3)_2$;
$CF_3(CF_2)_3(C_6H_4)C_2H_4SiCH_3(OCH_3)_2$;
$CF_3(CF_2)_5(C_6H_4)C_2H_4SiCH_3(OCH_3)_2$;
$CF_3(CF_2)_7(C_6H_4)C_2H_4SiCH_3(OCH_3)_2$;
$CF_3(CF_2)_3CH_2CH_2Si(OCH_2CH_3)_3$;
$CF_3(CF_2)_5CH_2CH_2Si(OCH_2CH_3)_3$;
$CF_3(CF_2)_7CH_2CH_2Si(OCH_2CH_3)_3$;
$CF_3(CF_2)_9CH_2CH_2Si(OCH_2CH_3)_3$;
$CF_3(CF_2)_7SO_2N(C_2H_5)C_2H_4CH_2Si(OCH_3)_3$

Moreover, as the reactive silicone (2), compounds having a skeleton represented by the following general formula can be presented.

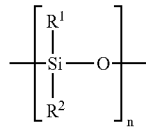

n is an integer of 2 or more, $R^1$, $R^2$ each are a substituted or non substituted alkyl, alkenyl, aryl or cyanoalkyl group having 1 to 10 carbon atoms, and 40% or less of the entirety based on the mole ratio is a vinyl, a phenyl, or a halogenated phenyl. Moreover, those having $R^1$, $R^2$ as a methyl group are preferable since the surface energy becomes the smallest, and it is preferable that a methyl group accounts for 60% or more based on the mole ratio. Moreover, at least one reactive group such as a hydroxyl group is provided in a molecular chain at the chain end or the side chain.

Moreover, together with the above-mentioned organopolysiloxane, a stable organosilicon compound with no cross-linking reaction such as a dimethylpolysiloxane may be mixed to a binder.

c. Decomposable Compound

In the second and third embodiments, it is necessary to incorporate, into the photocatalyst-containing wettability variable layer, a decomposable material which can be decomposed by action of the photocatalyst based on irradiation with energy, thereby varying the wettability on this layer. In other words, in the case that the binder itself does not have a function of varying the wettability on the photocatalyst-containing wettability variable layer and in the case that the binder insufficiently has such a function, the variation in the wettability on the layer is attained or assisted by the addition of the decomposable material.

The decomposable material is, for example, a surfactant which can be decomposed by action of the photocatalyst and has a function of varying the wettability of the surface of the photocatalyst-containing wettability variable layer by the decomposition. Specifically, hydrocarbons of the respective series of NIKKO L BL, BC, BO, and BB manufactured by Nikko Chemicals Co., Ltd., and fluorine base or silicone base nonionic surfactants such as ZONYL FSN and FSO manufacture by Du Pont Kabushiki Kaisha, Surflon S-141 and 145 manufactured by ASAHI GLASS CO., LTD., Megaface F-141 and 144 manufactured by DAINIPPON INK AND CHEMICALS, Inc., FTERGENT F-200 and F251 manufactured by NEOS, UNIDYNE DS-401 and 402 manufactured by DAIKIN INDUSTRIES, Ltd., and Fluorad FC-170 and 176 manufactured by 3M can be cited, and cationic surfactants, anionic surfactants and amphoteric surfactants also can be used.

Other than the surfactants, oligomers and polymers such as polyvinyl alcohol, unsaturated polyester, acrylic resin, polyethylene, diallyl phthalate, ethylene propylene diene monomer, epoxy resin, phenol resin, polyurethane, melamine resin, polycarbonate, polyvinyl chloride, polyamide, polyimide, styrene-butadiene rubber, chloroprene rubber, polypropylene, polybutylene, polystyrene, polyvinyl acetate, nylon, polyester, polybutadiene, polybenzimidazole, polyacrylonitrile, epichlorohydrine, polysulfide, polyisoprene and the like can be cited.

d. Containment of the Fluorine

Moreover, according to the present embodiment, it is preferable that the photocatalyst-containing wettability variable layer contains a fluorine, and furthermore, the photocatalyst-containing wettability variable layer is formed so as to have the fluorine content of the photocatalyst-containing wettability variable layer surface is lowered with respect to the state before the energy irradiation by the function of the photocatalyst at the time an energy is irradiated to the photocatalyst-containing wettability variable layer.

For the photocatalyst-containing wettability variable layer having such a characteristic, according to the pattern irradiation of the energy, a pattern having a part with a small fluorine content can be formed easily as detailed later. Here, since the fluorine has an extremely low surface energy, the surface of a substance containing a large amount of a fluorine has a smaller critical surface tension. Therefore, the critical surface tension of a part with a small fluorine content is larger than the critical surface tension of the surface of a substance with a large fluorine content. That is, it denotes that the part with a small fluorine content becomes a lyophilic area compared with the part with a large fluorine content. Therefore, by forming a pattern comprising a part with a small fluorine content compared with the surface of the periphery, a pattern of a lyophilic area is formed in a liquid repellent area.

Therefore, in the case such a photocatalyst-containing wettability variable layer is used, since a lyophilic area pattern can be formed easily in the liquid repellent area by the pattern irradiation of the energy, for example, in the case of coating a functional portion forming coating solution by the ink jet method, or the like, a highly precise functional portion can be formed.

As to the fluorine content in the photocatalyst-containing wettability variable layer containing a fluorine as mentioned above, the fluorine content in the lyophilic area having a low fluorine content formed by the energy irradiation is 10 or less based on the fluorine content in the area without the energy irradiation as 100, it is preferably 5 or less, and it is particularly preferably 1 or less.

According to the range, a large difference can be generated in terms of the lyophilic property in the energy irradiated part and the unirradiated part. Therefore, by adhering for example a functional portion forming coating solution to such a photocatalyst-containing wettability variable layer, the functional portion can be formed accurately only in the lyophilic area with the fluorine content lowered so that a functional element good in precision can be obtained. The lowering ratio is based on the weight.

As to the measurement of the fluorine content in the photocatalyst-containing wettability variable layer, various methods commonly executed can be used, and it is not particularly limited as long as it is a method capable of measuring the fluorine amount quantitatively on the surface such as the X-ray Photoelectron Spectroscopy, the ESCA (it is also referred to as the Electron Spectroscopy for Chemical Analysis), the fluorescent X ray analysis method, and the mass spectrometry.

Moreover, according to the present embodiment, a titanium dioxide can be used preferably as the photocatalyst as mentioned above. As the fluorine content in the photocatalyst-containing wettability variable layer in the case of using the titanium dioxide, it is preferable that the fluorine (F) element is contained in the photocatalyst-containing wettability variable layer surface by the ratio with the fluorine (F) element of 500 or more, preferably 800 or more, and particularly preferably 1,200 or more with the premise that the titanium (Ti) element is 100 according to the analysis and quantification by the X-ray Photoelectron Spectroscopy.

Since the fluorine (F) is contained in the photocatalyst-containing wettability variable layer to this extent, the critical surface tension on the photocatalyst-containing wettability variable layer can be made sufficiently low so that the liquid repellent property in the surface can be ensured. Thereby, the wettability difference of the pattern part with the fluorine content reduced by the energy pattern irradiation with respect to the surface lyophilic area can be made larger so that the precision of the pattern formed structure to be obtained finally can be improved.

Furthermore, according to such a pattern formed structure as to the fluorine content in the lyophilic area formed by the energy pattern irradiation, it is preferable that the fluorine (F) element is contained by the ratio of 50 or less, preferably 20 or less, and particularly preferably 10 or less with the premise that the titanium (Ti) element is 100.

In the case the fluorine content in the photocatalyst-containing wettability variable layer is reduced to this extent, a lyophilic property sufficient for forming a functional portion of the functional element can be obtained so that the functional element can be formed precisely according to the liquid repellent property and the wettability difference with respect to the part with the energy not irradiated, and thus a functional element having the high utilization value can be obtained.

e. Method for Forming the Photocatalyst-containing Wettability Variable Layer

In the case of using, as the binder, an organopolysiloxane described above, the photocatalyst-containing wettability variable layer can be formed by dispersing a photocatalyst, the organopolysiloxane as the binder, and optional other additives into a solvent to prepare a coating solution and then applying this coating solution onto a base material. As the solvent to be used, alcohol based organic solvents such as an ethanol and an isopropanol are preferable. The coating operation can be carried out by a known coating method such as spin coating, spray coating, dip coating, roll coating and bead coating. In the case an ultraviolet ray curable type component is contained as a binder, the photocatalyst-containing wettability variable layer can be formed with an execution of a cure process by irradiating an ultraviolet ray.

(Base Material)

The following will describe the base material used in the present embodiment. The base material is not limited to any especial kind if the base material is a material on which the photocatalyst-containing property variable layer can be formed. The base material is appropriately selected in accordance with such as the kind and use purpose of the pattern formed structure. The transparency and the flexibility thereof also are appropriately selected.

Examples of the base material used in the pattern formed structure include a resin-laminated plate having a paper base, a resin-laminated plate having a glass cloth base or a glass nonwoven cloth base, and ceramic and metallic plates.

(Patterning Substrate)

The following will describe the patterning substrate prepared in the present embodiment. No especial limitation is imposed on the patterning substrate if the patterning substrate is a substrate having the above-mentioned base material and photocatalyst-containing property variable layer. If necessary, the patterning substrate may have one or more different members.

In the embodiment, it is preferred that the base material is transparent and one or more light shielding parts are formed on the base material. This makes it possible to radiate energy onto the patterning substrate from the base material side thereof in the energy radiating process, which will be detailed later. In this case, the property of the photocatalyst-containing property variable layer in the area on which the light shielding parts are formed is not varied; therefore, a property variable pattern can be formed in a pattern form in which the light shielding parts are not formed without using any photomask or the like. In this case, light can reach the photocatalyst-containing property variable layer without diffusing even if, for example, a scattered light source is used as a light source for energy radiated in the energy radiating process, which will be detailed later. Accordingly, there is also produced an advantage that the scope from which the light source used in the energy radiating process is selected can be widened.

No especial limitation is imposed on the light shielding parts if the parts are parts capable of shielding the radiated energy. The method used for forming the light shielding parts is appropriately selected in accordance with the power for shielding to the required energy and other factors.

For instance, a metal thin film that is made of chromium or the like and formed into a thickness of about 1000 to 2000 Å by a sputtering method, a vacuum deposition method or the like is formed and patterned to form a shielding portion. As the patterning method, an ordinary patterning method such as the sputtering can be used.

A method may be one by which a layer that contains light-shielding particles such as carbon particulates, metal oxides, inorganic pigments and organic pigments in a resin binder is formed in a pattern. As the resin binders that can be used, a polyimide resin, acrylic resin, epoxy resin, polyacrylamide, polyvinyl alcohol, gelatin, casein, cellulose and the like can be used singularly or in combination of two or more kinds, and furthermore a photosensitive resin and an O/W emulsion type resin composition such as emulsified reactive silicone can be used. A thickness of such the resinous light-shielding part can be set in the range of 0.5 to 10 μm. As a method of patterning such the resinous light-shielding part, methods such as a photolithography method and a printing method that are generally used can be used.

Moreover, in the present embodiment, the light shielding part may be formed by the thermal transfer method. According to the thermal transfer method for forming the light shielding part in general, a light shielding part is formed by disposing on a base material a thermal transfer sheet with a photo thermal conversion layer and a light shielding part transfer layer provided on one side of a transparent film base material, and directing an energy to the area for forming the light shielding part so as to transfer the light shielding part transfer layer onto the base material. The film thickness of the light shielding part to be formed by the thermal transfer method is in general 0.5 µm to 10.0 µm, and in particular about 0.8 µm to 5.0 µm.

The light shielding part to be transferred by the thermal transfer method in general comprises a light shielding material and a binding agent. As the light shielding material, inorganic particles of a carbon black, a titanium black, or the like can be used. The particle size of the light shielding material is preferably in a range of 0.01 µm to 1.0 µm, in particular, in a range of 0.03 µm to 0.3 µm.

Moreover, as to the binding agent, it is preferable that it has a resin composition having the thermoplastic property and the thermosetting property, and it is preferable that it has a thermosetting functional group, a resin material having a softening point in a range of 50 to 150° C., in particular, 60 to 120° C., and a hardening agent, or the like. As such a material, specifically, an epoxy compound having two or more epoxy groups in one molecule, a combination of an epoxy resin and a potential hardening agent thereof, or the like can be presented. Moreover, as the potential hardening agent for an epoxy resin, a hardening agent not showing the reactivity with an epoxy resin up to a certain temperature and having the molecular structure change to show the reactivity with the epoxy resin at the time it reaches at the activating temperature by heating can be used. Specifically, a neutral salt or complex of an acidic or basic compound having the reactivity with an epoxy resin, a block compound, a high melting point substance, and a micro capsule contained substance can be presented. Moreover, in the light shielding part, in addition to the materials, a mold releasing agent, a bonding auxiliary agent, an antioxidant, a dispersing agent, or the like may be contained.

Here, according to the present embodiment, a primer layer may be formed between the photocatalyst-containing property variable layer and the light shielding part. Although the effect and the function of the primer layer is not always clear, it is considered that by forming the primer layer, the primer layer provides the function of preventing diffusion of the impurities from the opening part existing in the light shielding part or between the light shielding parts, in particular, impurities such as residues generated from the light shielding part is patterned, to be the factor of inhibiting the property of the photocatalyst-containing property variable layer from varying. Therefore, by forming the primer layer, the photocatalyst-containing property variable layer can be changed with a high sensitivity, and as a result, a pattern with a high resolution can be obtained.

In the present embodiment, since the primer layer is for preventing the influence on the photocatalyst effect by the impurities existing not only on the light shielding part but also in the opening part formed between the light shielding parts, it is preferable that the primer layer is formed on the entire surface of the light shielding part including the opening part.

The primer layer in the present embodiment is not particularly limited as long as it has a structure with the primer layer formed without having the light shielding part and the photocatalyst-containing property variable layer contacted.

The material for providing the primer layer is not particularly limited, but an inorganic material to be hardly decomposed by the function of the photocatalyst is preferable. Specifically, an amorphous silica can be presented. In the case of using the amorphous silica, the precursor of the amorphous silica is represented by the general formula: $SiX_4$. X is preferably a silicon compound such as a halogen, a methoxy group, an ethoxy group, an acetyl group, a silanol as a hydrolysis product thereof, or a polysiloxane having a 3,000 or less average molecular weight.

Moreover, the film thickness of the primer layer is preferably in a range of 0.001 to 1 µm, and particularly preferably in a range of 0.001 to 0.1 µm.

(2) Energy Radiating Process

The following will describe the energy radiating process in the present embodiment. No especial imitation is imposed on the energy radiating process if the process is a process of radiating energy at a given intensity onto the patterning substrate prepared in the patterning substrate preparing process, thereby the photocatalyst forms a property variable pattern in which the property of the photocatalyst-containing property variable layer is varied.

Specifically, the intensity of the energy radiated in the embodiment is preferably from 0.1 to 10 $mW/cm^2$, more preferably from 0.1 to 8 $mW/cm^2$, and even more preferably from 0.1 to 3 $mW/cm^2$. If the energy intensity is larger than the value, the the photocalytic reaction is poor and the efficiency is deteriorated. If the energy intensity is lower than the value, similarly the photocalytic reaction is poor and the efficiency is deteriorated. The energy intensity is a value obtained by totaling up illuminances at from 200 to 800 nm with a spectroradiometer USR-40, manufactured by USHIO INC. This energy intensity is lower than that of energy used ordinarily for patterning using the action of a photocatalyst based on irradiation with this energy. The use of this energy intensity makes it possible to excite the photocatalyst efficiently; in this case, therefore, the total light quantity can be made remarkably smaller than in the case of using the energy intensity used for ordinary patterning, thereby manufacturing a pattern formed structure effectively.

In the embodiment, the kind and so on of the energy are not particularly limited if the energy can be radiated at the above-mentioned intensity. The radiation intensity from various light sources used for ordinary patterning, such as a mercury lamp, a metal halide lamp, a xenon lamp, and an excimer lamp, may be dropped into an intensity within the above-mentioned range.

In the embodiment, the energy radiating process is performed using a fluorescent lamp which emits wavelengths preferably in the range of 250 to 450 nm, more preferably in the range of 280 to 430 nm, and even more preferably in the range of 300 to 380 nm. The lamp which emits wavelengths in this range can be rendered a line light source; accordingly, the lamp makes it possible to radiate energy onto a large area. Furthermore, the lamp is preferred from the viewpoint of production costs and production efficiency since any especial device is unnecessary. The light having the above-mentioned wavelength has an advantage that the light produces no effect onto the human body.

The fluorescent lamp which radiates light having the above-mentioned wavelengths is preferably a cold cathode type fluorescent lamp. The cold cathode type fluorescent lamp is in general longer in lifespan than any hot cathode type fluorescent lamp; thus, the former lamp makes it possible to work the radiating device at lower costs.

As the fluorescent lamp which radiates light having the above-mentioned wavelengths, a lamp called black light, health lamp, or germicidal lamp can be used. The black light is a lamp which can usually radiate light having wavelengths of about 300 to 430 nm. The health lamp is a lamp which can usually radiate light having wavelengths of about 280 to 320 nm. The germicidal lamp is a lamp which can usually radiate light having wavelengths of about 250 to 280 nm. The use of any one of these lamps makes the light radiating device small without using any especial unit and is also preferred from the viewpoint of costs.

The shape of the fluorescent lamp is not limited, and may be, for example, a spherical shape. The shape is preferably a straight-tube shape. This makes it possible to radiate light evenly along the width direction thereof, and perform patterning evenly. Since the length of such a fluorescent lamp can easily be adjusted, the lamp has an advantage that the light radiating device can be designed correspondingly to patterning substrates having various widths.

The energy radiation in the present process is performed to such a degree that the property of the photocatalyst-containing property variable layer can be varied. The total light quantity therefore is usually from about 0.05 to 5 $J/cm^2$, preferably from about 0.2 to 2 $J/cm^2$. Since energy is radiated at the above-mentioned intensity in the embodiment, the property of the photocatalyst-containing property variable layer can be varied even at such a small total light quantity.

No especial limitation is imposed on the light radiating device used in the method for manufacturing a pattern formed structure of the embodiment if the device is capable of radiating energy at the above-mentioned intensity. The device is appropriately selected in accordance with the kind of the light source therein, and other factors. This light radiating device may be, for example, a device having a patterning substrate supporting section for supporting the above-mentioned patterning substrate, and an energy radiating section for radiating the above-mentioned energy.

In this case, the patterning substrate supporting section may be a section for supporting the patterning substrate so as to be fixed oppositely to the energy radiating section. The energy radiating section may be a section for radiating energy partially onto the patterning substrate and radiating the energy plural times so as to cover the whole of a surface of the patterning substrate. Preferably, the above-mentioned fluorescent lamp is used to radiate energy onto the whole of a surface of the patterning substrate. This makes it possible to manufacture a property variable pattern effectively. This light radiating device may be a device in which a plurality of the light radiating units each having the patterning substrate supporting section and the energy radiating section are stacked.

(3) Others

If necessary, the method for the embodiment for manufacturing a pattern formed structure may appropriately comprise one or more different processes besides the above-mentioned patterning substrate preparing process and energy radiating process.

2. Second Embodiment

The following will describe a second embodiment of the method for manufacturing a pattern formed structure of the present invention. The method of the present embodiment is a method for manufacturing a pattern formed structure comprising: a patterning substrate preparing process of preparing a patterning substrate having a base material, a photocatalyst containing layer which is formed on the base material and comprises at least a photocatalyst, and a property variable layer which is formed on the photocatalyst containing layer and has a property variable by action of the photocatalyst based on irradiation with energy; and an energy radiating process of radiating energy onto the patterning substrate at a given intensity, thereby forming a property variable pattern in which the property of the property variable layer is varied.

Figure 2A:
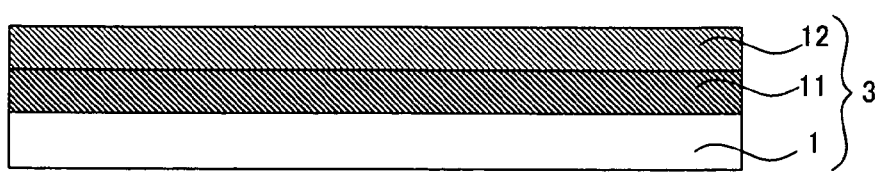
FIGS. 2A to 2C are process charts illustrating another example of the method for manufacturing a pattern formed structure of the invention.
Figure 2B:
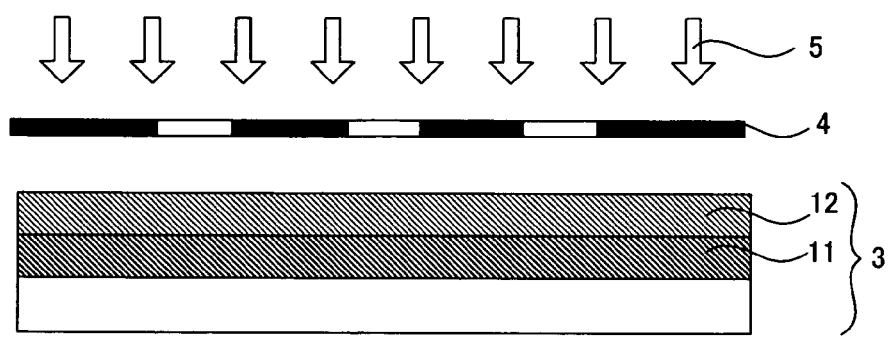
Figure 2C:
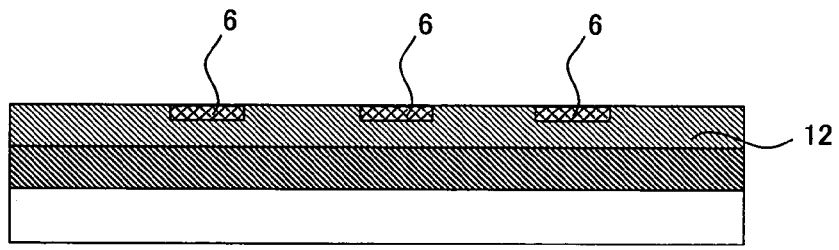

As shown in, e.g., FIGS. 2A to 2C, the method for manufacturing a pattern formed structure of the embodiment has a patterning substrate preparing process of preparing a patterning substrate 3 having a base material 1, a photocatalyst containing layer 11 formed on the base material 1, and a property variable layer 12 formed on the photocatalyst containing layer 2 (FIG. 2A), and an energy radiating process of radiating energy 5 having a given intensity onto the patterning substrate 3 through such as a photomask 4 (FIG. 2B), thereby forming a property variable pattern 6 in which the property of the property variable layer 12 is varied (FIG. 2C).

According to the embodiment, the patterning substrate has the property variable layer and the photocatalyst containing layer; therefore, the photocatalyst contained in the photocatalyst containing layer is excited by energy radiated in the energy radiating process, so as to form a property variable pattern in which the property of the property variable layer is varied by action of the photocatalyst. At this time, the radiated energy is made to have a given intensity, that is, an intensity smaller than the energy intensity used ordinarily for photocatalyst-excitation; accordingly, the photocatalyst can be more effectively excited and the necessary total light quantity can be made smaller. In this way, a pattern formed structure can be manufactured satisfactorily from the viewpoint of production efficiency and costs also.

The following will describe each of the processes.

(1) Patterning Substrate Preparing Process

First, the patterning substrate preparing process in the present embodiment is described. The patterning substrate preparing process is a process of preparing a patterning substrate having a base material, a photocatalyst containing layer which is formed on the base material and comprises at least a photocatalyst, and a property variable layer which is formed on the photocatalyst containing layer and has a property variable by action of the photocatalyst based on irradiation with energy.

In the process, the patterning substrate preparing method is not particularly limited if the method is a method capable of forming a patterning substrate having the base material, the photocatalyst containing layer and the property variable layer. Usually, the process can be rendered a process of forming the photocatalyst containing layer on the base material, and forming the property variable layer on the photocatalyst containing layer. The photocatalyst containing layer and the property variable layer will be described hereinafter. The base material may be the same as used in the first embodiment. Thus, detailed description thereof is omitted herein.

(Photocatalyst Containing Layer)

First, the photocatalyst containing layer, which is used in the patterning substrate prepared in the present process, is described. No especial limitation is imposed on the photocatalyst containing layer if the layer is a layer comprising at least a photocatalyst that can be excited by energy radiated in the energy radiating process which will be detailed later. This photocatalyst containing layer may be identical with the photocatalyst-containing property variable layer described about the first embodiment. However, in the embodiment, the property on the photocatalyst containing layer does not need to be varied; therefore, the property of the photocatalyst containing layer may not be varied by action of the photocatalyst onto the binder itself. Thus, it is unnecessary to incorporate, into the photocatalyst containing layer, a material for varying the property as in the first embodiment.

The method for forming the photocatalyst containing layer containing no binder may be a method using a vacuum film-forming method such as sputtering, CVD or vacuum vapor deposition. According to the formation by the vacuum film-forming method, it is possible to form, as an even film, the photocatalyst containing layer which contains only the photocatalyst. In this way, the property on the property variable layer can be evenly varied. Because of this matter and the matter that the layer is made only of the photocatalyst, the property on the property variable layer can be more effectively varied in this case than in the case of using a binder also.

Another example of the method for forming the photocatalyst-containing layer made only of a photocatalyst, is the following method: in the case that the photocatalyst is, for example, titanium dioxide, amorphous titania is formed on the base material and next fired so as to phase-change the titania to crystalline titania. The amorphous titania used in this case can be obtained, for example, by hydrolysis or dehydration condensation of an inorganic salt of titanium, such as titanium tetrachloride or titanium sulfate, or hydrolysis or dehydration condensation of an organic titanium compound, such as tetraethoxytitanium, tetraisopropoxytitanium, tetra-n-propoxytitanium, tetrabutoxytitanium or tetramethoxytitanium, in the presence of an acid. Next, the resultant is fired at 400 to 500° C. so as to be denatured to anatase type titania, and fired at 600 to 700° C. so as to be denatured to rutile type titania.

(Property Variable Layer)

The property variable layer used in the present embodiment will be described. About the property variable layer, the kind of the property-variation, and so on are not particularly limited if the layer is a layer the property of which can be varied by action of the photocatalyst in the photocatalyst containing layer excited by the energy radiated in the energy radiating process, which will be detailed later. The layer may be, for example, a layer which is varied in adhesive property to a material by action of the photocatalyst or a layer which is varied in adhesive property to cells based on irradiation with energy.

In the embodiment, the property variable layer is preferably a wettability variable layer the contact angle of which with a liquid is lowered by action of the photocatalyst based on, in particular, irradiation with energy, or a decomposition removing layer which is decomposed and removed by action of the photocatalyst based on irradiation with energy since a functional portion can easily be formed on the pattern formed structure. The following will describe the wettability variable layer and the decomposition removing layer.

a. Wettability Variable Layer

No especial limitation is imposed on the wettability variable layer used in the embodiment if the layer is a layer the contact angle of which with a liquid is lowered by action of the photocatalyst contained in the photocatalyst containing layer. This layer is preferably made of the same material for the binder in the photocatalyst-containing wettability variable layer in the first embodiment. When the wettability variable layer made of the above-mentioned component is used in the embodiment, it is possible to use the action of oxidization, decomposition or the like of an organic group which is a moiety of the component or an additive, based on action of the photocatalyst contained in the adjacent photocatalyst containing layer, to vary the wettability of the region irradiated with energy, thereby making the region lyophilic so as to generate a large difference in wettability between the region and the region not irradiated with the energy. It is allowable to incorporate, into this wettability variable layer, the same fluorine as described in the item "Incorporation of fluorine" about the photocatalyst-containing wettability variable layer in the first embodiment in the same way as described therein. In the embodiment, it is unnecessary to incorporate any photocatalyst into the wettability variable layer. In this case, it is possible to make small the possibility that the functional portion is affected by any photocatalyst with the passage of time. The method for forming the wettability variable layer used in the embodiment, the material, or the like of the layer may be the same as described about the photocatalyst-containing wettability variable layer in the first embodiment. Thus, description thereof is omitted herein.

About the wettability variable layer used in the embodiment, in the region not irradiated with energy, that is, in the liquid repellent region, preferably, the contact angle with a liquid having a surface tension of 40 mN/m is 10° or more, more preferably, the contact angle with a liquid having a surface tension of 30 mN/m is 10° or more, and even more preferably the contact angle with a liquid having a surface tension of 20 mN/m is 10° or more for the following reason: the region not irradiated with the energy is a region for which liquid repellency is required; therefore, in the case that the contact angle with the above-mentioned liquid is small, the liquid repellency is insufficient; and, for example, when a colored layer forming coating solution for forming a colored layer of a color filter is applied by an ink-jetting method and hardened so as to form the colored layer, the colored layer forming coating solution may adhere onto the liquid repellent region also; it therefore becomes difficult to form a functional portion, for example, such a colored layer, highly precisely.

About the wettability variable layer, in the region irradiated with energy, that is, in the lyophilic region, preferably, the contact angle with a liquid having a surface tension of 40 mN/m is less 9°, more preferably, the contact angle with a liquid having a surface tension of 50 mN/m is 10° or less, and even more preferably the contact angle with a liquid having a surface tension of 60 mN/m is 10° or less for the following reason: in the case that the contact angle with the liquid is high in the region irradiated with the energy, that is, in the lyophilic region, the lyophilic region also repels, for example, a colored layer forming coating solution for forming a colored layer of a color filter; and, for example, when the colored layer forming coating solution is applied by an ink-jetting method, this solution is not sufficiently applied or spread; it therefore becomes difficult to form a functional portion, for example, such a colored layer. The contact angle with a liquid, referred to herein, is measured by the above-mentioned method.

In the embodiment, the thickness of the wettability variable layer is preferably from 0.001 to 1 μm, more preferably from 0.01 to 0.1 μm. This makes it possible to render this layer a layer the wettability of which is effectively varied by action of the photocatalyst in the photocatalyst containing layer in the energy radiating process, which will be detailed later.

b. Decomposition Removing Layer

The following will describe the decomposition removing layer used in the present embodiment. No especial limitation is imposed on the decomposition removing layer if the layer is a layer in which a portion irradiated with light can be decomposed and removed by action of the light having the above-mentioned wavelengths.

Since the decomposition removing layer is decomposed or removed by action of the above-mentioned light, it is possible to form a pattern composed of one or more portions having the decomposition removing layer and one or more portions having no decomposition removing layer, that is, a pattern having irregularities, without performing any developing process or washing process.

This decomposition removing layer is oxidized and decomposed by action of light in the light-radiation, so as to be gasified or the like. Accordingly, the layer is removed without performing any especial post-treatment such as a developing or washing process. However, a washing process or the like may be performed in accordance with the material of the decomposition removing layer.

It is preferred that the decomposition removing layer used in the embodiment has a higher contact angle with a liquid than the surface of the above-mentioned base material as well as irregularities are formed in this layer. This makes it possible to decompose and remove the decomposition removing layer to render the region where the base material is exposed and the region where the decomposition removing layer remains a lyophilic region and a liquid repellant region, respectively, thereby forming various patterns using the irregularities in the surface and a wettability difference on the surface.

Preferably, the contact angle of the decomposition removing layer surface with a liquid having a surface tension of 40 mN/m is 10° or more, more preferably, the contact angle with a liquid having a surface tension of 30 mN/m is 10° or more, and even more preferably the contact angle with a liquid having a surface tension of 20 mN/m is 10° or more in the embodiment.

In the case that the property variable layer is the decomposition removing layer in the embodiment, the base material is preferably lyophilic. Specifically, the contact angle with a liquid having a surface tension of 40 mN/m is preferably 9° or less, more preferably 5° or less, and even more preferably 1° or less.

When the wettability of the decomposition removing layer and the base material is within the above-mentioned range, the region where the base material is exposed and the region where the decomposition removing layer remains can be rendered a lyophilic region and a liquid repellant region, respectively, thereby easily forming a highly precise pattern. The contact angle with a liquid, referred to herein, is a value measured by the above-mentioned method.

In this case, the base material may be a base material subjected to surface treatment so as to have a lyophilic surface. An example of this surface treatment is lyophilic surface treatment with plasma using argon, water or the like. An example of a lyophilic layer to be formed on the base material is a silica film obtained by a sol-gel method of tetraethoxysilane. In the embodiment, the portion where the base material is exposed is usually rendered a lyophilic region.

Specific examples of the film which can be used as the above-mentioned decomposition removing layer include fluorine-containing or hydrocarbon-based resin films having liquid repellency. The fluorine-containing or hydrocarbon-based resin is not limited to any especial kind if the resin has water repellency. In the embodiment, a resin having a fluoroalkyl group is preferred. This is because active oxygen species generated in the energy radiating process, which will be detailed later, act easily on the fluoroalkyl group so that the decomposition removing layer can be effectively decomposed and removed, as described above. The decomposition removing layer in the embodiment can be formed by dissolving such a resin into a solvent and then applying the solution into a film form by an ordinary film-forming method such as spin coating.

In the embodiment, the decomposition removing layer having no defect can be formed by use of a functional film such as a self assembled monomolecular film, a Langmuir-Blodgett film, or an alternating adsorption film. Thus, it is preferred to use a method for forming such a film. The self assembled monomolecular film, the Langmuir-Blodgett film, or the alternating adsorption film may be the same as described in, e.g., JP-A No. 2003-195029. Thus, detailed description thereof is omitted herein.

(Patterning Substrate)

The following will describe the patterning substrate prepared in the present embodiment. No especial limitation is imposed on the patterning substrate if the patterning substrate is a substrate having the above-mentioned base material, photocatalyst-containing layer and property variable layer. If necessary, the patterning substrate may have one or more different members.

In the embodiment, it is preferred that a light shielding part is formed on the base material or the photocatalyst containing layer. In the case that the light shielding part is formed on the base material and the base material is transparent, energy can be radiated onto the patterning substrate from the base material side thereof in the energy radiating process, which will be detailed later. Even if a light source which emits scattered light is used as the light source in the energy radiating process in this case, effect of diffusion of the light onto the patterning substrate can be made small. Consequently, a pattern formed structure can be effectively manufactured at low costs. Furthermore, energy can be radiated only onto the region where no light shielding part is formed without using a photomask or the like; therefore, an advantage that the process of positioning any photomask or other process is unnecessary is also produced.

The light shielding part, a primer layer for preventing impurities generated from the light shielding part, and so on may be the same as in the first embodiment. Thus, detailed description thereof is omitted herein.

(2) Energy Radiating Process

The following will describe the energy radiating process in the present embodiment. No especial limitation is imposed on the energy radiating process if the process is a process of radiating energy onto the patterning substrate at a given intensity, thereby forming a property variable pattern in which the property of the property variable layer is varied.

Specifically, the intensity of the energy radiated in the embodiment is preferably from 0.1 to 10 mW/cm$^2$, more preferably from 0.1 to 8 mW/cm$^2$, and even more preferably from 0.1 to 3 mW/cm$^2$. If the energy intensity is larger than the value, the photocalytic reaction is poor and the efficiency is deteriorated. If the energy intensity is lower than the value, similarly the photocalytic reaction is poor and the efficiency is deteriorated. The energy intensity is a value obtained by the above-mentioned method. This energy intensity is lower than that of energy used ordinarily for patterning using the action of a photocatalyst based on irradiation with the energy. In the embodiment, the use of this energy intensity makes it possible to excite the photocatalyst containing layer efficiently. Accordingly, in this case, the total light quantity can be made remarkably smaller than in the case of using the energy intensity used for ordinary patterning, thereby manufacturing a pattern formed structure effectively.

The lamp and the light radiating device for radiating such energy, and so on may be the same as in the energy radiating process in the first embodiment. Thus, detailed description thereof is omitted herein.

(3) Others

The present embodiment may also appropriately have one or more necessary processes other than the above-mentioned patterning substrate preparing process and energy radiating process.

B. Method for Manufacturing a Functional Element

The following will describe the method for manufacturing a functional element of the present invention. The method comprises a functional portion forming process of forming a functional portion on the property variable pattern of the pattern formed structure manufactured by the method described in the item "A. Method for manufacturing a pattern formed structure".

According to the invention, the property variable pattern, which has a varied pattern, is formed in the pattern formed structure; therefore, a property difference inside this property variable pattern is used to make it possible to perform easily the functional portion forming process, wherein a functional portion is formed.

The word "functional" means one or more out of various functions such as optical functions (such as light selective absorption, reflectivity, polarizability, light selective transparency, nonlinear optical property, luminescence such as fluorescence or phosphorescence, and photochromism); magnetic functions (such as hard magnetism, soft magnetism, non-magnetism, magnetic permeability); electric or electronic functions (such as electroconductivity, electric insulation, piezoelectricity, pyroelectricity and dielectricity); chemical functions (such as adsorption, desorption, catalytic property, water absorptivity, ion conductivity, redox property, electrochemical property, and electrochromism); mechanical functions (such as abrasion resistance); thermal functions (such as heat transfer property, adiathermancy, and infrared ray radiating property), and biological functions (such as living body adaptability, and antithrombotic property).

The functional portion forming coating solution used in the functional portion forming process in the invention is largely varied in accordance with the kind of the functional element to be manufactured, the method for forming the element, and other factors, as described above. The coating solution may be, for example, a composition not diluted with any solvent, such as an ultraviolet curable monomer, a liquid composition diluted with a solvent, or the like. It is particularly preferred that the viscosity of the functional portion forming coating solution is smaller since a pattern can be formed in a shorter time. In the case of a liquid composition diluted with a solvent, the viscosity thereof is raised or the surface tension thereof is changed by the volatilization of the solvent at the time of forming a pattern. It is therefore desired that the solvent has a low volatility.

The functional portion forming coating solution used in the invention may be a solution which is stuck and arranged onto the above-mentioned property variable pattern, thereby turning into a functional portion, or a solution which is arranged onto the property variable pattern and then subjected to treatment with a chemical agent, ultraviolet rays, heat or the like, thereby turning into a functional portion. In this case, it is preferred that the functional portion forming coating solution contains, as a binder therefore, a component curable by ultraviolet rays, heat, an electron beam, or the like since a functional portion can be rapidly formed by curing treatment.

The functional portion forming process in the invention is preferably performed by a coating method such as dip coating, roll coating, blade coating or spin coating, a nozzle jetting-out method such as a method using ink-jetting, electric field jetting or a dispenser, or some other method. The use of the method makes it possible to form a functional portion evenly and highly precisely.

Of various methods of the present invention for manufacturing the functional element, preferred are a method for manufacturing a color filter in which its functional portion is a colored layer, a method for manufacturing an electroconductive pattern in which its functional portion is metallic wiring, a method for manufacturing a base material for biochip in which its functional portion has adhesive property to a biological material, and a method for manufacturing an organic EL element in which its functional portion is an organic EL layer. This is because the functional portions of these functional elements can easily be formed using a property difference inside the above-mentioned pattern formed structure.

C. Method for Manufacturing a Color Filter

The method for manufacturing a color filter of the invention will be described hereinafter. The method is a method in which the functional portion forming process in the above-mentioned method for manufacturing a functional element is a process of forming a colored layer.

According to the invention, in the case that the property variable layer or the photocatalyst-containing property variable layer in the pattern formed structure is, for example, a wettability variable layer or a photocatalyst-containing wettability variable layer having a wettability-variable surface, a wettability variable pattern having varied wettability is formed on the layer. Accordingly, using a wettability difference inside the surface, a colored layer can easily be formed by ink-jetting or the like. Thus, a color filter having a highly precise colored layer can be manufactured.

Such a colored layer is usually formed in three colors of red (R), green (G) and blue (B). The form of the colored pattern in the colored layer can be rendered a known form, such as a stripe form, a mosaic form, a triangular form, a four-pixel arrangement form. The colored area of the colored layer can be set at will.

The method for forming this colored layer is not particularly limited in the invention. Examples thereof include a coating method of applying a known colored layer forming coating solution by a known method such as spray coating, dip coating, roll coating or bead coating; and a vacuum thin-film forming method. In the invention, it is preferred to form the colored layer by ink-jetting since this method makes it possible that the colored layer is highly precisely formed onto the property variable pattern.

The colored layer forming coating solution used for the formation of such a colored layer, and so on may be the same as used in a colored layer in an ordinary color filter. Thus, detailed description thereof is omitted herein.

D. Method for Manufacturing an Electroconductive Pattern

The following will describe a method for manufacturing an electroconductive pattern of the invention. The method is a method in which the functional portion forming process in the above-mentioned method for manufacturing a functional element is a process of forming metallic wiring.

According to the invention, an electroconductive pattern in which highly precise metallic wiring is formed can be manufactured by applying a metallic paste or the like by, for example, an electric field jetting method using a property difference inside the above-mentioned property variable pattern.

In the invention, the metallic wiring is formed on the property variable layer or the photocatalyst-containing property variable layer; thus, the electric resistance of the property variable layer or the photocatalyst-containing property variable layer is set preferably into the range of $1 \times 10^8$ to $1 \times 10^{18}$ Ω·cm, more preferably into the range of $1 \times 10^{12}$ to $1 \times 10^{18}$ Ω·cm. This makes it possible to form an excellent electroconductive pattern.

The material for each of the members used for the method for manufacturing an electroconductive pattern of the invention, the method for forming each of the members, and so on may be the same as about ordinary electroconductive patterns. Thus, description thereof is omitted herein.

E. Method for Manufacturing an Organic EL Element

The following will describe a method for manufacturing an organic EL element of the invention. The method is a method in which the functional portion forming process in the above-mentioned method for manufacturing a functional element is a process of forming an organic EL layer.

According to the invention, using a property difference inside the above-mentioned property variable pattern, an organic EL layer can easily applied onto a specific area and so on, thereby making it possible to manufacture an organic element in which a highly precise organic EL layer is formed.

In the invention, it is particularly preferred that the above-mentioned property variable layer or photocatalyst-containing property variable layer contains therein an electroconductive material. This makes it possible that even if the property variable layer or photocatalyst-containing property variable layer is formed on the base material having on the surface thereof, for example, a first electrode layer, holes or the like permeate through this layer. Accordingly, electric conduction can be attained between the first electrode layer and the organic EL layer made by use of the property variable pattern of these layers. The organic EL element according to the invention can be yielded, for example, by forming a second electrode layer on this organic EL layer.

The material for each of the members used for the method for manufacturing an organic EL pattern of the invention, the method for forming each of the members, and so on may be the same as about ordinary organic EL elements. Thus, description thereof is omitted herein.

F. Method for Manufacturing a Base Material for Biochip

The following will describe the method for manufacturing a base material for biochip of the invention. The method is a method in which the functional portion forming process in the above-mentioned method for manufacturing a functional element is a process of forming a functional portion having adhesive property to a biological material. The functional portion forming process in the invention can be rendered, for example, a process of causing a material having adhesive property to a biological material to adhere onto the above-mentioned property variable pattern. This makes it possible to prepare a base material for biochip which has adhesive property to the biological material in a pattern form.

When the biological material is immobilized onto this base material for biochip, a biochip can be obtained. On the surface of this biochip, the above-mentioned functional thin film works as an immobilizing layer. In the case that a biological material such as DNA or a protein is immobilized onto this layer, the resultant can be used for various articles.

To such a biological material immobilizing technique can be applied immobilizing techniques which have been actively researched in the development of bioreactors in which an enzyme is immobilized onto an insoluble carrier. The content of the techniques are detailed in, for example, "Immobilized Enzyme" edited by Ichiro Chihata and published by Kodansha Scientific in 1975, and reference documents described therein.

In some cases, an electrical reading method is used for biochips. In such cases, it is necessary to form electrodes on the surface of the above-mentioned base material for biochip. The electrodes may be formed by the same method as described about the above-mentioned method for manufacturing an electroconductive pattern, or may be formed by an ordinary photoresist method or the like.

In the invention, it is allowable to use a molecule having a functional group protected by a photosensitive protecting group in the property variable layer or photocatalyst-containing property variable layer, de-protect the functional group by action of a photocatalyst based on irradiation with energy so as to form a pattern having cell adhesive property, and cause cells to adhere in the form of this pattern onto the layer, thereby manufacturing a biochip.

The material for each of the members used for the method for manufacturing a base material for biochip of the invention, the method for forming each of the members, and so on may be the same as about ordinary base materials for biochip. Thus, description thereof is omitted herein.

The present invention is not limited to the embodiments. The embodiments are merely examples, and any one having the substantially same configuration as the technological idea disclosed in the claims of the present invention and the same effects is included in the technological scope of the present invention.

EXAMPLES

Hereinafter, the present invention will be explained in further details with reference to the examples.

Example

<Formation of a Patterning Substrate>

Titaniasol (trade: STS-01, manufactured by ISHIHARA SANGYO KAISHYA, LTD.) was diluted with a mixed solution of water and isopropanol (ratio by weight=1:1) to give a $TiO_2$ concentration of 0.5% by weight, thereby preparing a photocatalyst containing layer forming composition. The composition was applied onto a glass substrate (trade: NA-35, manufactured by NH Techno Glass Corp.) in which black light shielding parts having carbon black were formed in a line and space form having a width of 40 μm and a pitch of 150 μm by spin coating, and then the resultant was fired at 200° C. for 15 minutes to form a photocatalyst containing layer.

Next, 1.5 g of a fluoroalkylsilane (trade name: TSL 8233, manufactured by GE Toshiba Silicones), 5.0 g of tetramethoxysilane (trade name: TSL 8114, manufactured by GE Toshiba Silicones) and 2.5 g of 0.01-N hydrochloric acid were stirred at room temperature for 24 hours to prepare a liquid repellency giving agent. This agent was diluted 20 times with isopropanol to prepare a property variable layer forming composition. The property variable layer forming composition was applied onto the photocatalyst containing layer by spin coating, so as to form a patterning substrate.

<Light Exposure>

Energy was radiated from a black light (trade name: FL-40S-BLB, manufactured by TOSHIBA LIGHTING & TECHNOLOGY CORPORATION) onto the patterning substrate from the glass substrate side thereof for 600 seconds, so as to perform light exposure. The luminance of the black light was measured with a spectroradiometer (trade name: USR 40, manufactured by USHIO INC). As a result, the luminance was 1.5 mW/cm², and the total exposure quantity was 0.9 J/cm².

<Formation of a Color Filter>

Next, an ink-jetting device of a piezoelectric driving type was used to apply a UV curable polyfunctional acrylate monomer ink (coloring ink), in each color of R, G and B, containing 5 parts by weight of a pigment, 20 parts by weight of a solvent, 5 parts by weight of a polymerization initiator and 70 parts by weight of a UV curable resin onto an opening portion of the above-mentioned patterning substrate. The resultant was subjected to UV treatment to cure the resins, thereby forming a pixel portion. In this way, a color filter was formed. About each of the red, green and blue inks, polyethylene glycol monomethylethyl acetate was used as the solvent, an Irgacure (transliteration) 369 (trade name) (manufactured by Ciba Specialty Chemicals) was used as the polymerization initiator, and DPHA (dipentaerythritol hexaacrylate) (manufactured by NIPPON KAYAKU CO., LTD.) was used as the UV curable resin. The following were used as the pigments in the red ink, the green ink, and the blue ink: C. I. Pigment Red 177, C. I. Pigment green 36, and C. I. Pigment Blue 15 & C. I. Pigment Violet 23, respectively.

Comparative Example 1

A color filter was formed in the same way as in Example 1 except that light exposure was performed by radiating energy from a super high mercury lamp onto a patterning substrate formed in the same way as in Example 1 from the glass substrate side thereof. At this time, the illuminance of the super high mercury lamp was measured in the same way as in Example 1. As a result, the illuminance was 200 mW/cm$^2$. The time for the light exposure was adjusted to set the total exposure quantity to 5.8 J/cm$^2$.

Comparative Example 2

A color filter was formed in the same way as in Comparative Example 1 except that the total light quantity was set to 11.7 J/cm$^2$.

[Evaluation of the Color Filters]

About each of the color filters formed in Example, and Comparative Examples 1 and 2, the relationship between the external appearance thereof and the total exposure quantity is shown in Table 1. In Comparative Example 1, the total exposure quantity was small and the property of the property variable layer was not able to be satisfactorily varied so that white spots were generated in the colored layer. However, according to the present invention, a good color filter having no white spots was able to be produced even at a radiated energy amount of 1/10 or less of the radiated energy amount in Comparative Example 1.

TABLE 1

|  | Example 1 | Comparative Example 1 | Comparative Example 2 |
|---|---|---|---|
| Total exposure quantity (J/cm$^2$) | 0.9 | 9.4 | 11.7 |
| White spots | Not found | Found | Not found |

What is claimed is:

1. A method for manufacturing a pattern formed structure, comprising:
a patterning substrate preparing process of preparing a patterning substrate having a base material and a photocatalyst-containing property variable layer which is formed on the base material, comprises at least a photocatalyst and a binder, and has a property variable by an action of the photocatalyst based on an irradiation with an energy; and
an energy radiating process of radiating the energy in pattern form onto the patterning substrate at an intensity of 0.1 to 10 mW/cm$^2$, thereby forming a property variable pattern in which the property of a region irradiate with the energy of the photocatalyst-containing property variable layer is varied.

2. The method for manufacturing a pattern formed structure according to claim 1, wherein a light shielding part is formed on the base material or on the photocatalyst-containing property variable layer of the patterning substrate, and a radiation of the energy in the energy radiating process is performed from a side of the base material.

3. The method for manufacturing a pattern formed structure according to claim 2, wherein the energy radiation is performed from a fluorescent lamp which emits light having a wavelength in a range of 250 to 450 nm.

4. The method for manufacturing a pattern formed structure according to claim 3, wherein the fluorescent lamp is a cold cathode type fluorescent lamp and is a lamp selected from a black light, a health lamp, and a germicidal lamp.

5. The method for manufacturing a pattern formed structure according to claim 1, wherein the energy radiation is performed from a fluorescent lamp which emits light having a wavelength in a range of 250 to 450 nm.

6. The method for manufacturing a pattern formed structure according to claim 5, wherein the fluorescent lamp is a cold cathode type fluorescent lamp and is a lamp selected from a black light, a health lamp, and a germicidal lamp.

7. A method for manufacturing a functional element, comprising a functional portion forming process of forming a functional portion on the property variable pattern of a pattern formed structure manufactured by the method for manufacturing a pattern formed structure according to claim 1.

8. A method for manufacturing a color filter, wherein the functional portion forming process in the method for manufacturing a functional element according to claim 7 is a colored layer forming process of forming a colored layer.

9. A method for manufacturing an electroconductive pattern, wherein the functional portion forming process in the method for manufacturing a functional element according to claim 7 is a process of forming a metallic wiring.

10. A method for manufacturing an organic electroluminescent element, wherein the functional portion forming process in the method for manufacturing a functional element according to claim 7 is a process of forming an organic electroluminescent layer.

11. A method for manufacturing a base material for biochip, wherein the functional portion forming process in the method for manufacturing a functional element according to claim 7 is a process of forming the functional portion having an adhesive property to a biological material.

12. A method for manufacturing a pattern formed structure, comprising:
a patterning substrate preparing process of preparing a patterning substrate having a base material, a photocatalyst containing layer which is formed on the base material and comprises at least a photocatalyst, and a property variable layer which is formed on the photocatalyst containing layer and has a property variable by an action of the photocatalyst based on an irradiation with an energy; and
an energy radiating process of radiating the energy in pattern form onto the patterning substrate at an intensity of 0.1 to 10 mW/cm$^2$, thereby forming a property variable pattern in which the property of a region irradiate with the energy of the property variable layer is varied.

13. The method for manufacturing a pattern formed structure according to claim 12, wherein a light shielding part is formed on the base material or on the photocatalyst containing layer of the patterning substrate, and a radiation of the energy in the energy radiating process is performed from a side of the base material.

14. The method for manufacturing a pattern formed structure according to claim 13, wherein the energy radiation is performed from a fluorescent lamp which emits light having a wavelength in a range of 250 to 450 nm.

15. The method for manufacturing a pattern formed structure according to claim 14, wherein the fluorescent lamp is a cold cathode type fluorescent lamp and is a lamp selected from a black light, a health lamp, and a germicidal lamp.

16. The method for manufacturing a pattern formed structure according to claim 12, wherein the energy radiation is performed from a fluorescent lamp which emits light having a wavelength in a range of 250 to 450 nm.

17. The method for manufacturing a pattern formed structure according to claim 16, wherein the fluorescent lamp is a cold cathode type fluorescent lamp and is a lamp selected from a black light, a health lamp, and a germicidal lamp.

18. A method for manufacturing a functional element, comprising a functional portion forming process of forming a functional portion on the property variable pattern of a pattern formed structure manufactured by the method for manufacturing a pattern formed structure according to claim 12.

19. A method for manufacturing a color filter, wherein the functional portion forming process in the method for manufacturing a functional element according to claim 18 is a colored layer forming process of forming a colored layer.

20. A method for manufacturing an elcetroconductive pattern, wherein the functional portion forming process in the method for manufacturing a functional element according to claim 18 is a process of forming a metallic wiring.

21. A method for manufacturing an organic electroluminescent element, wherein the functional portion forming process in the method for manufacturing a functional element according to claim 18 is a process of forming an organic electroluminescent layer.

22. A method for manufacturing a base material for biochip, wherein the functional portion forming process in the method for manufacturing a functional element according to claim 18 is a process of forming the functional portion having an adhesive property to a biological material.

* * * * *